US007280884B2

(12) United States Patent
Tadano et al.

(10) Patent No.: US 7,280,884 B2
(45) Date of Patent: Oct. 9, 2007

(54) OPTIMIZATION METHOD OF DEPOSITION TIME AND AN OPTIMIZATION SYSTEM OF DEPOSITION TIME

(75) Inventors: Akira Tadano, Sakata (JP); Yusuke Inoue, Yamatokoriyama (JP); Isao Yokoyama, Sakata (JP)

(73) Assignee: Seiko Epson Corporation (JP)

( * ) Notice: Subject to any disclaimer, the term of this patent is extended or adjusted under 35 U.S.C. 154(b) by 549 days.

(21) Appl. No.: 10/785,711

(22) Filed: Feb. 23, 2004

(65) Prior Publication Data

US 2004/0225453 A1 Nov. 11, 2004

(30) Foreign Application Priority Data

Feb. 24, 2003 (JP) .............................. 2003-046029

(51) Int. Cl.
*G06F 19/00* (2006.01)
(52) U.S. Cl. ...................................... 700/121
(58) Field of Classification Search ................. 700/121
See application file for complete search history.

(56) References Cited

U.S. PATENT DOCUMENTS 5,798,141 A 8/1998 Harada

FOREIGN PATENT DOCUMENTS

| JP | 05-032500 | 2/1993 |
| JP | 07-074166 | 3/1995 |
| JP | 8-172084 | 7/1996 |
| JP | 11-186249 | 7/1999 |
| JP | 2002-184705 | 6/2002 |

OTHER PUBLICATIONS

Translation of JP 11-186249.*
Translation of JP 9-205049.*
Translation of JP 05-032500.*
Saki K. and S. Kawase, et al. "Novel Approach for Precise Control of Oxide Thickness." Semiconductor Manufacturing Symposium, 2001 IEEE International (2001): 451-454.*

* cited by examiner

*Primary Examiner*—Ryan A Jarrett
(74) *Attorney, Agent, or Firm*—Harness, Dickey & Pierce, P.L.C.

(57) ABSTRACT

An optimum method for deposition time is provided that can improve uniformity of processing time of oxidation thickness. When starting a heat oxidation process, a time for optimum oxidation processing in the process management system is calculated based on atmospheric pressure data, a target thickness of that process, oxidization time, thickness data and atmospheric pressure data in the immediately preceding process under the same oxidization processing job. The optimum system comprises a process management system such as a host computer, a device having a barometer, a heat oxidation-processing device and a thickness-measuring device. The host computer, the barometer, the heat oxidation processing device and the thickness-measuring device are connected via a network so as to transmit data to and from each device.

9 Claims, 10 Drawing Sheets

FIG. 3

Example) process history for HEAT1
1 lot1 model A process A recipe A
2 lot2 model A process B recipe B
3 lot3 model A process C recipe C
4 lot4 model B process A recipe A
5 lot5 model C process C recipe C
6 lot5 model A process A recipe A

OPTIMIZATION METHOD OF DEPOSITION TIME AND AN OPTIMIZATION SYSTEM OF DEPOSITION TIME

RELATED APPLICATIONS

This application claims priority to Japanese Patent Application No. 2003-046029 filed Feb. 24, 2003 which is hereby expressly incorporated by reference herein.

BACKGROUND OF THE INVENTION

1. Technical Field

The present invention relates to an optimization method for deposition time. More particularly, the present invention relates to an optimization method for deposition time in a thermal oxidization technique that is affected by a change in atmospheric pressure.

2. Related Art

Conventionally, thermal oxidation processing receives environmental influences such as atmospheric pressure at the time of processing and a change over time within an apparatus. Without correction with fine-tuning of oxidization time, poor processing such as an imbalanced thickness value results. In particular, atmospheric pressure change becomes a factor in fluctuating the characteristics of products in thin film processing. In addition, the following jobs have been performed in response to such influences and have different changes in each apparatus or job: a) whenever a worker processes a product, he or she writes down oxidation time and atmospheric pressure data at the time of processing; b) data of an immediately preceding processed lot of the same oxidation process is searched; c) current atmospheric pressure is examined and compared with the data described in b) (The data is input to a program for calculation only, and the next oxidization is calculated); and d) a worker inputs the calculated data of oxidation time into a thermal oxidation processing apparatus. In addition, a control method for the oxidation, which is a diffusion processing condition with atmospheric pressure, is disclosed. This technology automatically corrects oxidation time by atmospheric pressure data (see Japanese Patent Publication Laid-Open No. 5-32500 for example).

However, the conventional technology has the following problems.

The correction is completed only by atmospheric pressure, and there is no system that feeds back a value of an immediately preceding lot. Namely, there is no system of performing correction with high accuracy such as a feedback approach for the next oxidization time which considers the thickness result of the immediately preceding lot of the same oxidization process. In addition, the data input operation is manual and therefore it is possible to input inaccurate data. Also, it takes a great amount of time to observe atmospheric pressure data, as well as input and output data with manual handling. This results in poor operation efficiency.

In view of the above problems, the present invention is intended to a) calculate the optimum time for oxidization processing with a process management system based on atmospheric pressure data at the start (starting time) of processing, a target value of thickness in the process, data of oxidization time atmospheric pressure and thickness at the time of the immediately preceding process of the same oxidization processing job. Further, the invention is intended to b) directly download the calculated time for the oxidation process to a thermal oxidation apparatus via an on-line system and start product processing. c) Usually, a barometer is not installed in the thermal oxidation processing device such that atmospheric pressure data are delivered to a process management system from other semiconductor devices via on-line communication and used. d) Thickness data, oxidation time, and atmospheric pressure data are integrally processed by a process control system such that an immediately preceding lot processed from past data of the same oxidization processing job, thermal oxidization time, thickness data, and atmospheric pressure data related to the lot are retrieved. By performing the above a) to d), the present invention can provide an optimization method for deposition time that improves the uniformity of processing time for an oxidized thickness technique.

SUMMARY

An optimization method for the deposition time in a thermal oxidation process according to a first aspect of the present invention comprises: a first step of inputting a target thickness value of a product model processed as thermal oxidation into a host computer; a second step of transmitting current atmospheric pressure data at the time processing starts obtained from a barometer and comparative data into the host computer via a network, the comparative data including the oxidization time of an immediately preceding processed lot in the same oxidization process as the product model and an average thickness value; a third step of adding a first correction value obtained from the difference between the value of target thickness and the actual thickness value during a period of oxidization processing for the immediately preceding processed lot and a second correction value obtained from the difference between the current atmospheric pressure data and a correction value of atmospheric pressure obtained from the previous atmospheric pressure data, and the third step calculating a time for the optimized oxidization process based on the result of the addition; and a fourth step of transmitting the calculated time for the optimized oxidization processing to an apparatus for performing the thermal oxidization process via the network.

Further, according to the first aspect of the present invention, in the third step, the first correction value is calculated based on a value that is obtained from subtracting the average thickness value of an immediately preceding processed lot from a target thickness value of the same oxidization processing job; and the second correction value is calculated based on an atmospheric pressure at the time of processing an immediately preceding lot and a current atmospheric pressure.

Furthermore, in the optimization method for deposition time according to the first aspect of the present invention, the third step includes a searching process where the current lot and an immediately preceding lot recorded in the data base corresponding to the same oxidization processing job are searched and the comparison data is obtained.

Furthermore, in the third step of the optimization method for deposition time according to the first aspect of the present invention, the first correction value is calculated by dividing the value, obtained from subtracting the average thickness value of a processed lot from a target thickness value of the same oxidization processing job, with the rate of thickness to oxidization processing time for each piece of equipment or each processing job that is a rate of thickness growing speed per unit time; and the second correction value is calculated by a difference between a first atmospheric pressure function at the time of processing an immediately preceding lot and a second atmospheric pressure function at the current atmospheric pressure, wherein:

the atmospheric pressure function=$aP^2+bP+c$;

P is atmospheric pressure; and a, b, and c are fixed numbers.

Furthermore, in the optimization method for deposition time according to the first aspect of the present invention, the searching step includes: a step for judging a product model that searches an immediately preceding processed lot, which was recorded in the data base and judges whether the processed lot belongs to the same product model as the current lot or not; a step for judging whether the processed lot belongs to the same process or not, when the processed lot belongs to the same product model as the current lot in the step for judging a product model; a step for judging whether the processed lot belongs to the same recipe or not, when the processed lot belongs to the same process as the current lot in the step for judging a process; a step for judging that the processed lot belongs to the same oxidization processing job, when the processed lot belongs to the same recipe as the current lot in the step for judging a recipe and adopting the processed lot as the comparative data.

Furthermore, in the optimization method for deposition time according to the first aspect of the present invention, in the step for judging a recipe (in the step for searching), the method is returned to a step that searches an immediately preceding processed lot, when the recipe is determined not to be the same; in the step for judging a process, the method is returned to a step that searches an immediately preceding processed lot, when the process is determined not to be the same; and in the step for judging a product model, the method is returned to a step that searches an immediately preceding processed lot, when the product model is determined not to be the same.

Furthermore, an optimization system for deposition time in a thermal oxidation process which uses a network according to a second aspect of the present invention comprises: a host computer that receives a target thickness value for a product model processed with thermal oxidation and calculates the most suitable oxidation processing time; a barometer that acquires current atmospheric pressure data which is atmospheric pressure data at the start (starting time) of processing; and a database that records comparison data which includes oxidation processing time, an average thickness value and an atmospheric pressure value, wherein the host computer:

receives the current atmospheric pressure data and the comparison data of the immediately preceding processed lot with an oxidation processing job that is the same for the product model via the network; adds a first correction value calculated from the difference between the target thickness value and the actual value during the time for processing the immediately preceding processed lot with oxidation, with a second correction value calculated from the difference of atmospheric pressure correction values derived from the current atmospheric pressure data and the previous atmospheric pressure value; calculates the most optimized time for thermal oxidization processing based on the addition; sends the most optimized time for thermal oxidization processing to an apparatus for performing thermal oxidization processing via the network, wherein:

the first correction value is calculated based on the value obtained by subtracting the average thickness value of the immediately preceding processed lot from the target thickness value in the same oxidation processing job and the second correction value is calculated based on an atmospheric pressure at the time of processing the immediately preceding processed lot and a current atmospheric pressure.

Furthermore, in the optimization system for deposition time according to the second aspect of the present invention, the host computer searches the immediately preceding lot and the current processed lot recorded in the database corresponding to the same oxidation processing job are searched and the comparison data is obtained.

Furthermore, in the optimization system for deposition time according to the second aspect of the present invention, the first correction value is calculated by dividing the value obtained from subtracting the average thickness value of a processed lot from a target thickness value on the same oxidization processing job, with the rate of thickness and oxidization processing time for each piece of equipment or each processing job that is a rate of thickness growing speed per unit time; and the second correction value is calculated by the difference between a first atmospheric pressure function at the time of processing an immediately preceding processed lot and a second atmospheric pressure function at the current atmospheric pressure, wherein:

the atmospheric pressure function=$aP^2+bP+c$; and

P is atmospheric pressure; and a, b, and c are fixed numbers.

Furthermore, in the optimization method for deposition time according to the second aspect of the present invention, the host computer searches an immediately preceding processed lot, which was recorded in the data base; judges whether the processed lot belongs to the same product model as the current lot or not; judges whether the processed lot belongs to the same process or not, when the processed lot belongs to the same product model as the current lot; judges whether the processed lot belongs to the same recipe or not, when the processed lot belongs to the same process as the current lot; judges that the processed lot belongs to the same oxidization processing job, when the processed lot belongs to the same recipe as the current lot and adopts the processed lot as the comparative data.

Furthermore, in the optimization method for deposition time according to the second aspect of the present invention, the host computer searches an immediately preceding processed lot, when the recipe is determined not to be the same; searches an immediately preceding processed lot, when the process is determined not to be the same, and searches an immediately preceding processed lot, when the product model is determined not to be the same.

Furthermore, in the thermal oxidization processing apparatus, the apparatus receives the most optimized time for thermal oxidization processing that is calculated by the host computer in the optimization method for deposition time according to the second aspect of the present invention via a network and performs the oxidization processing based on the most optimized time for thermal oxidization processing.

Furthermore, the computer program making the host computer execute the operation in the optimization method for deposition time according to the first aspect of the present invention includes coded versions of each of the steps in the first aspect of the present invention.

BRIEF DESCRIPTION OF THE DRAWINGS

FIG. 3 shows data processed with the heat oxidation-processing device of FIG. 1 and the expected data.

DETAILED DESCRIPTION

Preferred embodiments of the present invention will be described in detail hereinafter with reference to the attached drawings.

Figure 1:
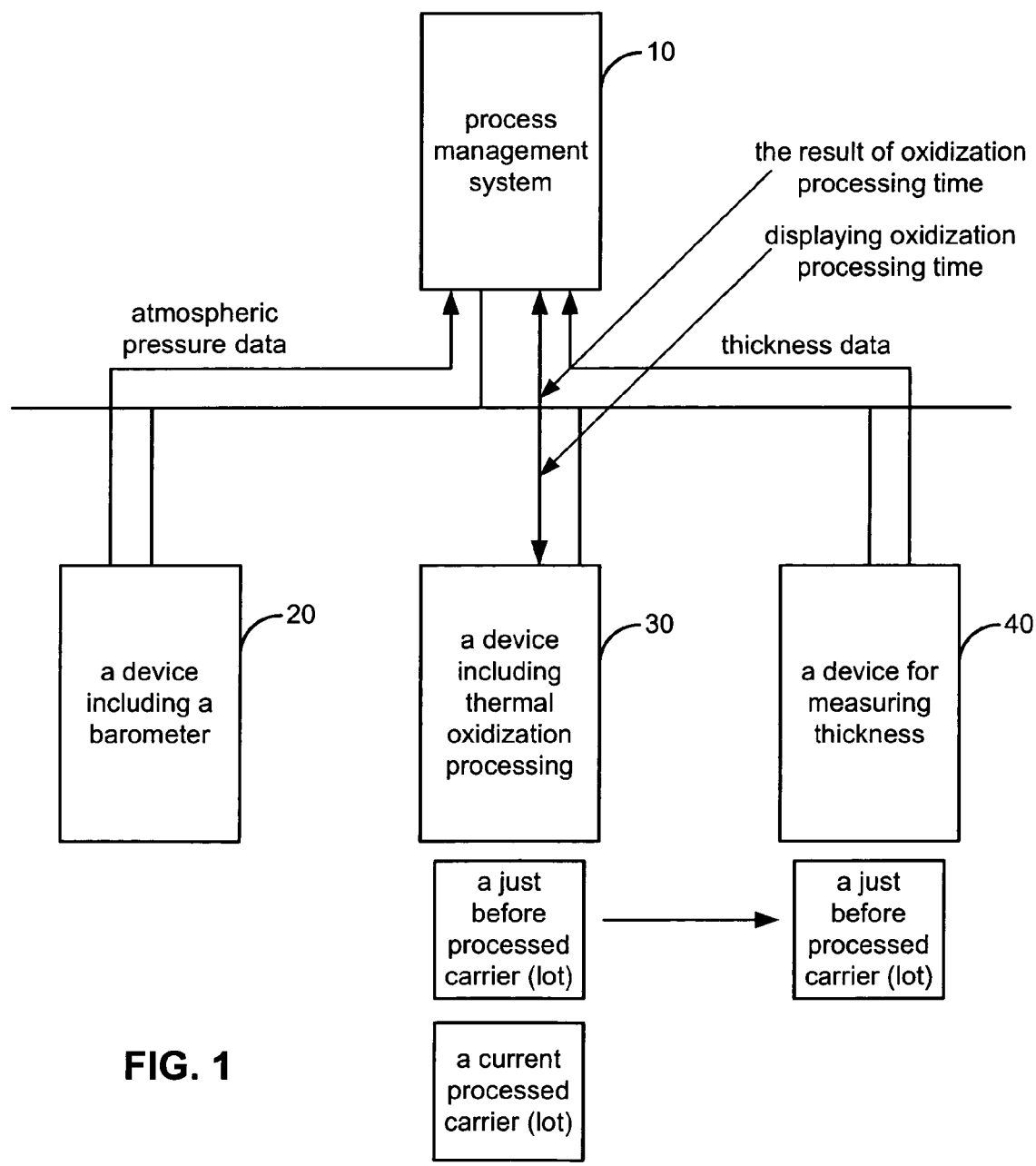
FIG. 1 shows an overall structure of an optimization system for deposition time related to the preferred embodiment of the present invention.

As shown in FIG. 1, the optimization system for deposition time comprises a process management system 10 (HOST computer), an apparatus having a barometer 20 (a barometer), a thermal oxidation processing device 30 and a thickness measurement device 40. The HOST computer 10 is coupled to the barometer 20, the thermal oxidation processing device 30 and the thickness measurement device 40 via a network.

The HOST computer 10 not only corrects the atmospheric pressure data from the barometer 20 but also searches an immediately preceding lot (processed by the same oxidization process job) of which a predetermined condition coincides with that of a processed lot from a data base (not shown) coupled to the HOST computer 10 and feeds the values of conditions, such as atmospheric pressure data and oxidation processing time, back to the processed lot.

Figure 2:
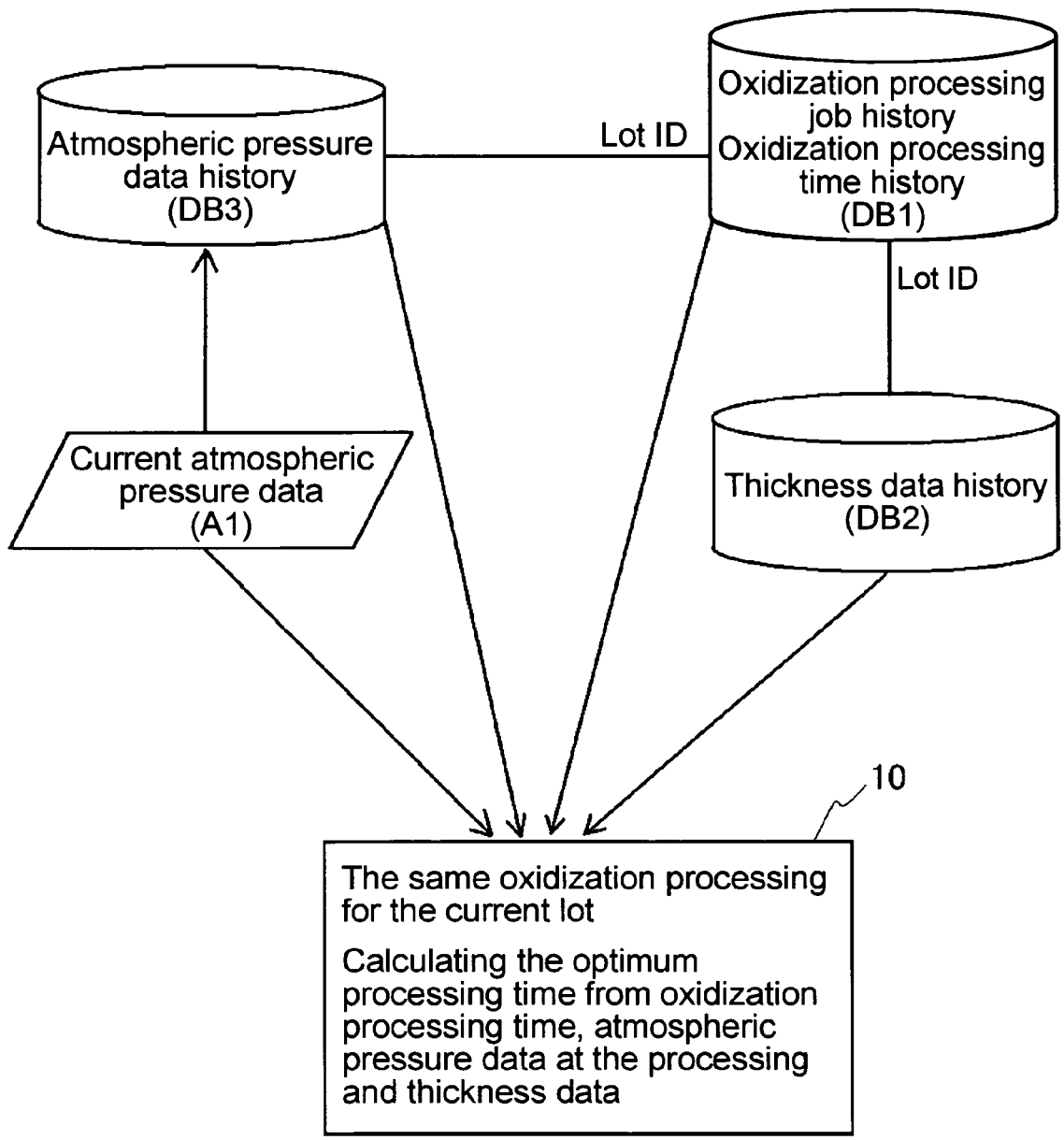
FIG. 2 shows a flow of data management in a heat oxidation process of a heat oxidation-processing device of FIG. 1.

FIG. 2 shows a flow of data management in the thermal oxidation process (oxidation processing) of the thermal oxidation-processing device 30 of FIG. 1.

When starting thermal oxidization processing, the target thickness value for thermal oxidization processing is input to the HOST computer 10.

The HOST computer 10 calculates the optimized oxidization processing time based on data (comparative data) for calculating process conditions. These process conditions include: the current atmospheric pressure data A1 obtained from the barometer 20 at the start (start time) of the process; oxidation processing time in the last process with the same oxidation processing job from a first database DB1 that is an oxidation processing job history and oxidation processing time history database (a database of oxidation processing time); thickness data in the last process with the same oxidation processing job from a second database DB2 that is a thickness data history database (a database of thickness data); and atmospheric pressure data in the last process with the same oxidation processing job from an atmospheric pressure data history database DB3 (a database of atmospheric pressure data).

A calculation method of the most optimum oxidation processing time fed back by the HOST computer 10 will now be explained in detail.

When the oxidation time (the most optimum oxidation processing time) for a processed lot (current processing lot) by the thermal oxidation processing device 30 is NVA seconds, the central value of thickness normalization of an immediately preceding lot regarding the same oxidization processing job (the target thickness value) is BMID $\square$, the average thickness value of the immediately preceding lot regarding the same oxidization processing job is BAVG $\square$, the oxidation processing time for an immediately preceding lot in the same oxidization processing job is BVA $\square$, the atmospheric pressure value at the time of processing an immediately preceding lot in the same oxidation processing job is BAIR hpa, (hectopascal), the current atmospheric pressure value (the current atmospheric pressure data A1) is NAIR hpa, and the rate between thickness and oxidation processing time for each job or each device is RATE $\square$/second (oxidized processed thickness per unit time), the following approximation can be shown:

NVA=(BMID−BAVG)/RATE+(F(BAIR)−F(NAIR))/RATE+BVA . . . (a), wherein the atmospheric function $F(p)=aP^2+bP+c$;

P represents the previous atmospheric pressure value and/or the current atmospheric pressure data; and a, b, and c are fixed numbers.

The first correction value (the first term) is calculated as follows. First, the average thickness value of an immediately preceding processed lot in the same oxidization processing job is subtracted from a normalized thickness value of an immediately preceding processed lot in the same oxidization processing job. The result of this subtraction is divided by the RATE (in seconds) of the average oxidized processed thickness value per unit of time for an immediately preceding processed lot in the same oxidization processing job (in seconds, although minutes may be used depending on the size of the correction value). This first correction value has a positive relationship with oxidation processing time.

The second correction value (the second term) is calculated as follows. First, a first atmospheric pressure value at the time of processing an immediately preceding processed lot is subtracted from a value at the current atmospheric pressure obtained by an approximation formula. The result of this subtraction is divided by the above RATE. This second correction value corrects the thickness difference yielded from the atmospheric difference between an immediately preceding processed lot and the current process lot. In this embodiment, this is calculated as a=0, b=0.4, and c=0.

Figure 3:
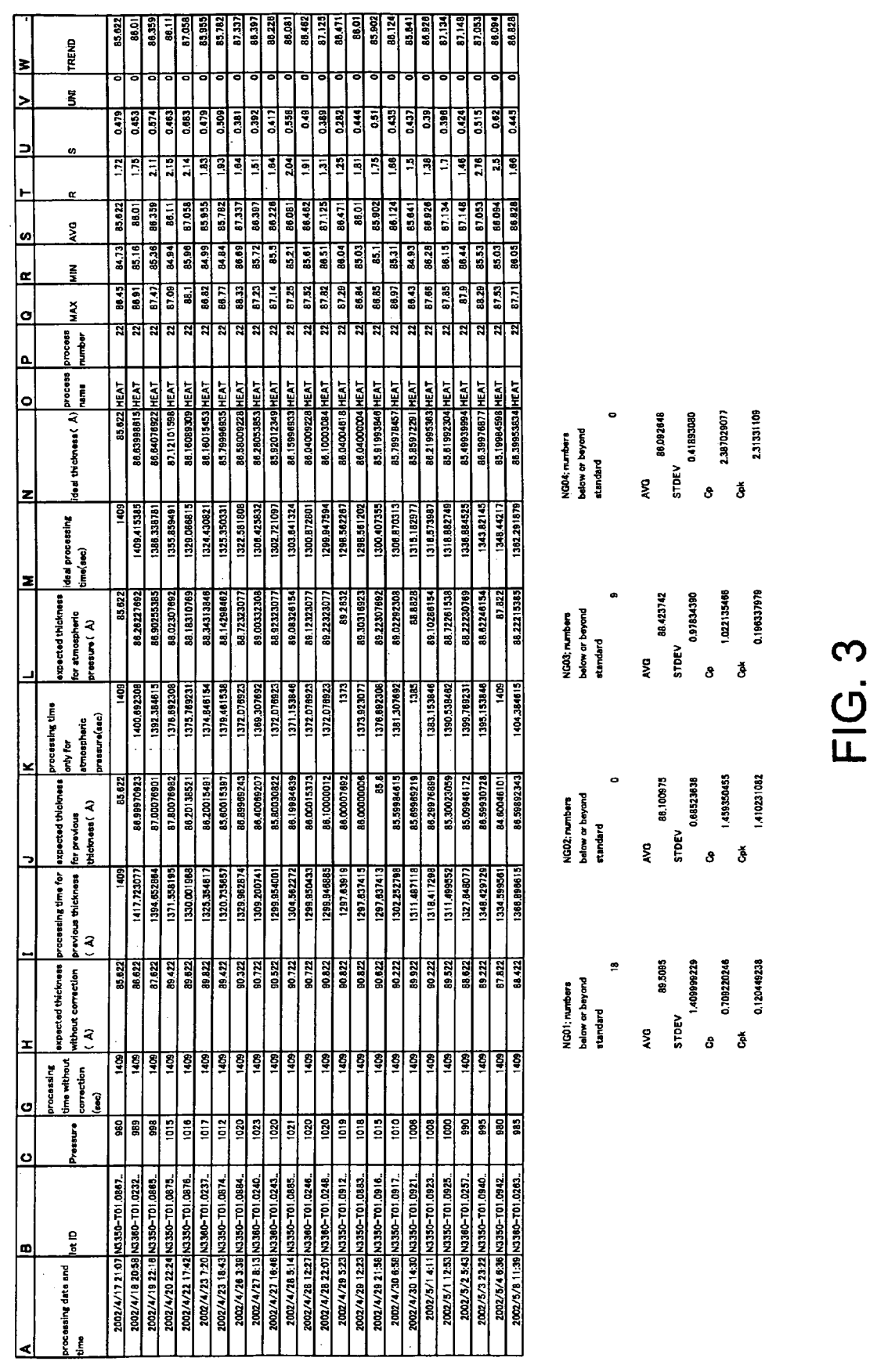

FIG. 3 shows the table of data processed by the heat oxidation-processing device 30 in FIG. 1 and the expected data.

In FIG. 3, processed time and date A, atmospheric pressure data C (in units of hpa) at the lot ID (lot) B, processed time G without correction (in units of seconds) and expected thickness H without correction (in units of $\square$) are shown. Time is omitted in the processing date A of FIG. 1. The expected thickness H without correction is the expected value when the processed time is a predetermined value (1409 seconds) based on actual processed average thickness (not shown) and its process time.

In addition, the time I only for the previous thickness (in units of seconds) is time added with only the first corrected value. The expected thickness value J for the previous thickness value (in units of □) is the thickness that is expected from the time I only for processing the previous thickness.

The time for processing in atmospheric pressure K (in units of seconds) is the processing time with the addition of only the second corrected value. The expected thickness value for atmospheric pressure (in units of □) is the thickness that is expected from the processing time K.

The ideal processing time M (in units of seconds) is the time including the first corrected value and the second corrected value. The ideal thickness value N (in units of □) is the thickness that is expected from the ideal processing time M.

In addition, the upper limit a01 of thickness in the standard is 89 □, the lower limit b01 of thickness is 83 □, and the center value c01 in the standard is 86 □.

Figure 4:
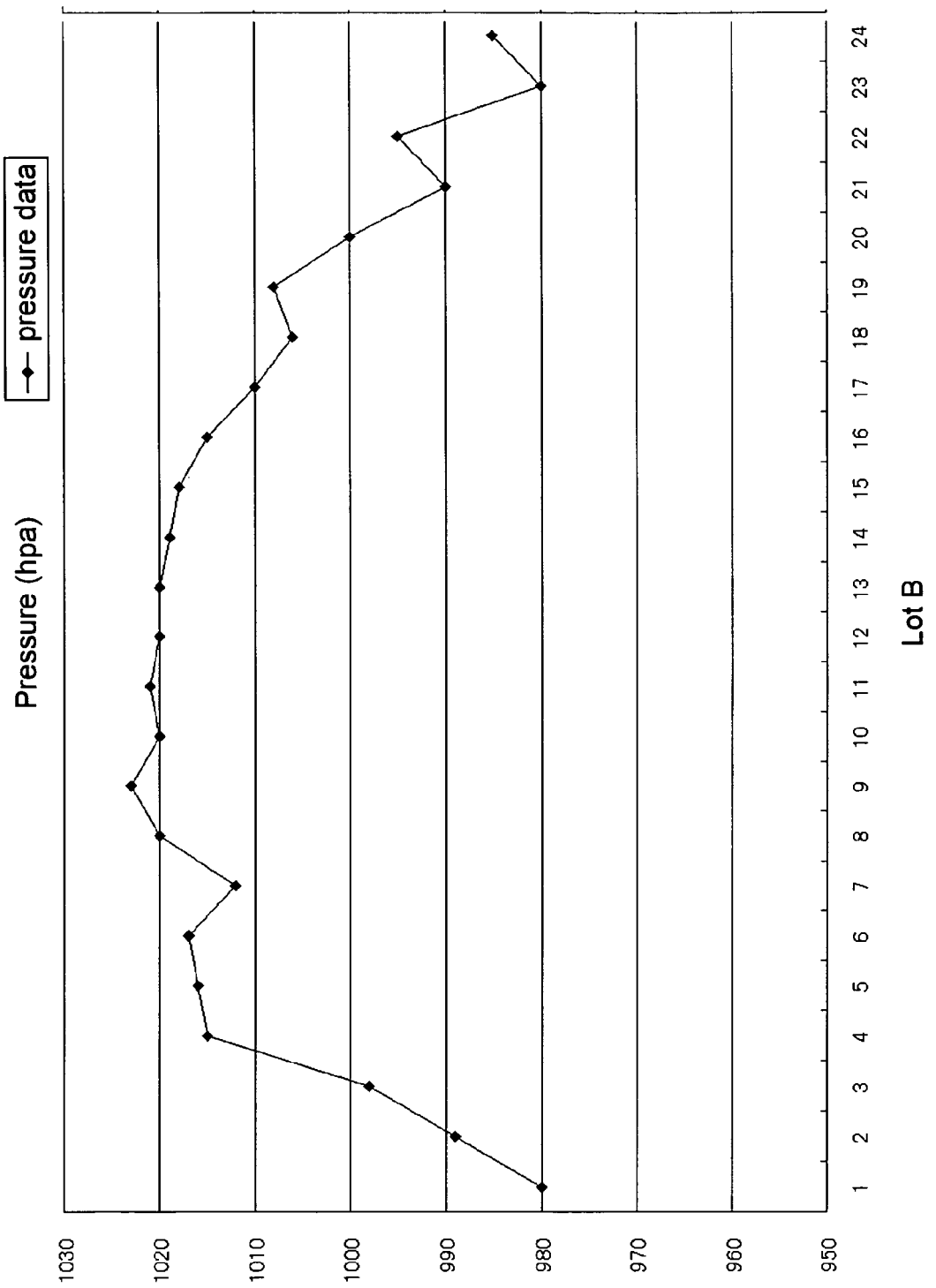
FIG. 4 illustrates a plot of the atmospheric pressure data of FIG. 3.

FIG. 4 shows atmospheric pressure data C plotted from FIG. 3. The plot indicates the atmospheric pressure data C for every lot B in FIG. 3 (1-24 in the figure) (in units of hpa).

Figure 5:
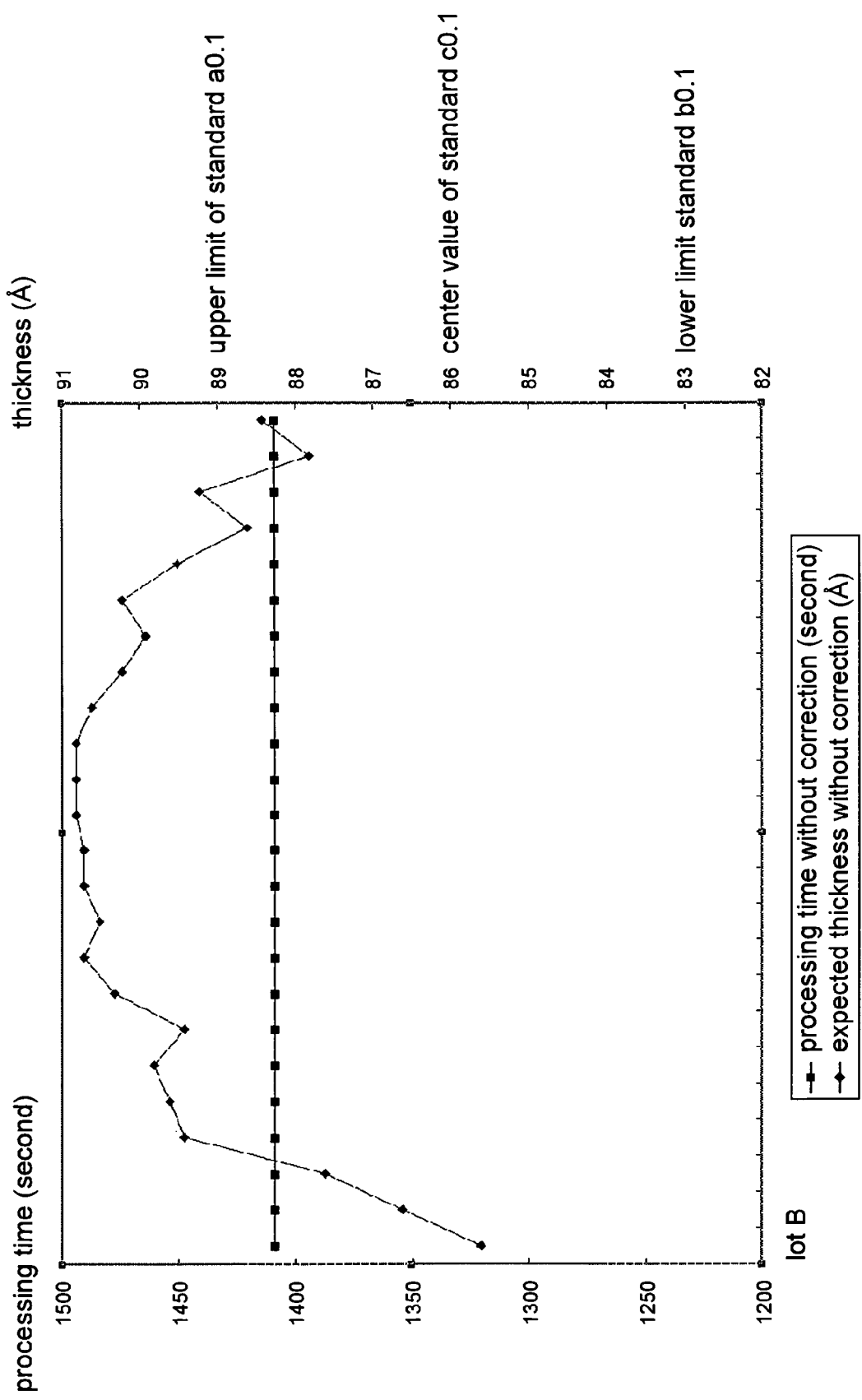
FIG. 5 illustrates a plot of the processing time without correction and expected thickness without correction from FIG. 3

FIG. 5 shows a plot of the processing time G without correction and the expected thickness H without correction from FIG. 3.

The data when the processing time G without correction and the expected thickness H without correction for every lot B in FIG. 3 (1-24 in the figure) are set to be 1409 seconds are plotted. The numbers G01 deviated from the upper limitation standard a01 and the lower limitation standard b01 of thickness are 18. In addition, the index of potential process capability Cp is 0.7, and the index of process capability Cpk is 0.12.

Figure 6:
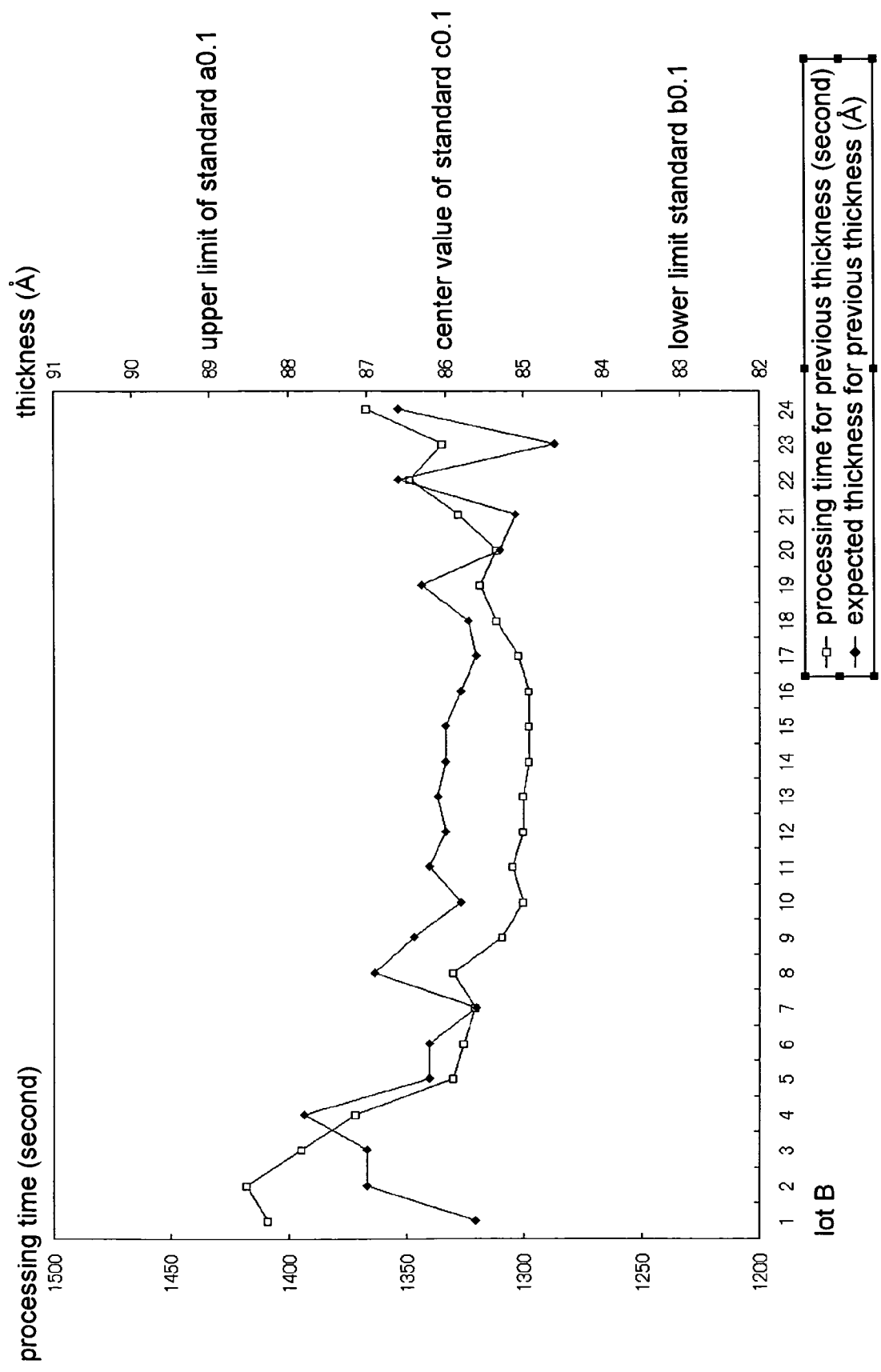
FIG. 6 illustrates a plot of the processing time only for the previous thickness of FIG. 3 and expected thickness for the previous thickness.

FIG. 6 shows a plot of the time I only for processing the previous thickness and the expected thickness value J for the previous thickness value from FIG. 3.

The data of the time I only for the previous thickness which is the time including the first corrected value for every lot B (1-24 in the figure) and the expected thickness value J for the previous thickness value which is the thickness in the above condition in FIG. 3 are plotted.

The numbers NG02 deviated from the standard in the expected thickness value J for the previous thickness value is zero. In addition, the index of potential process capability Cp is 1.46, and the index of process capability Cpk is 1.41.

Figure 7:
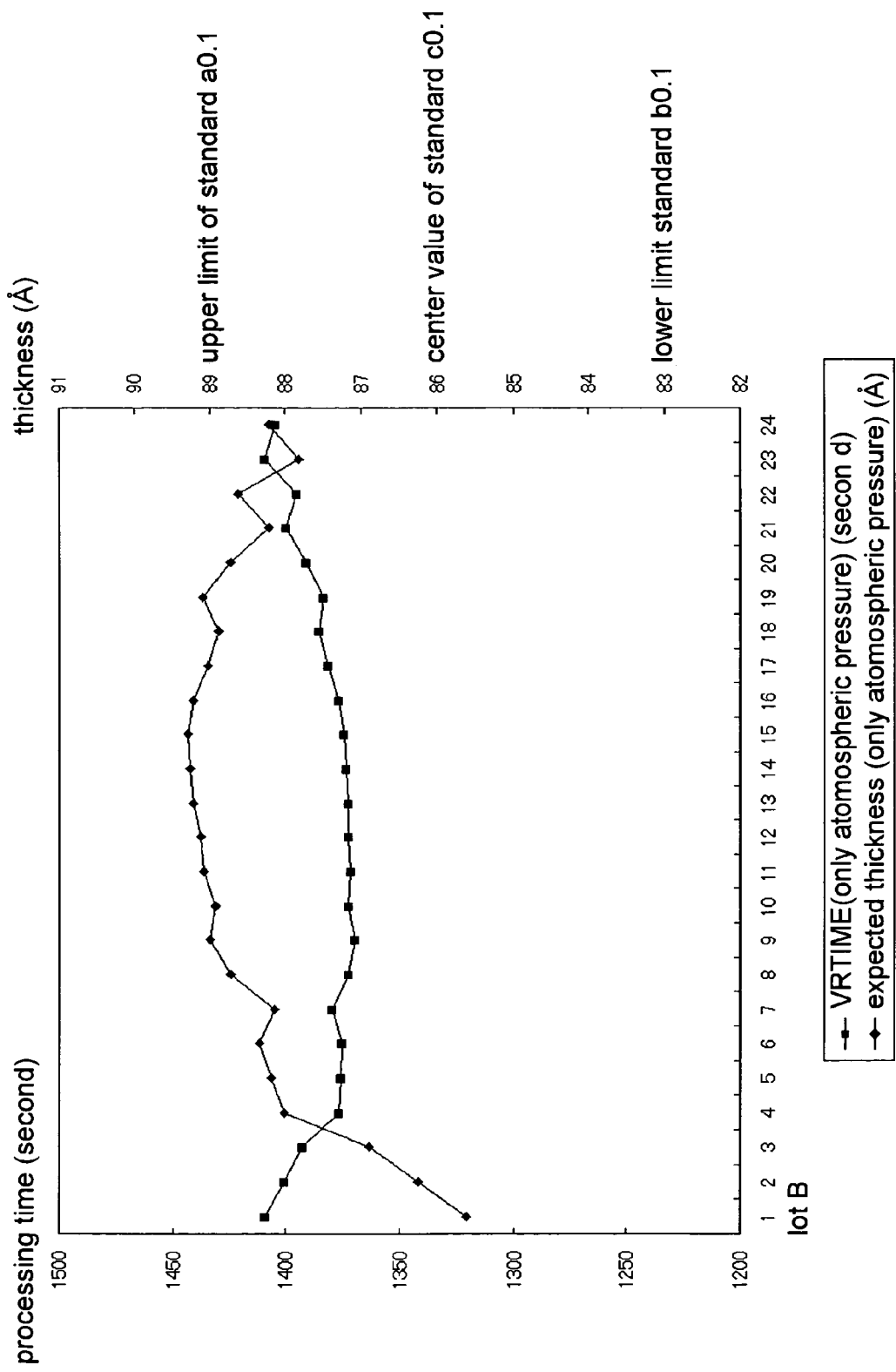
FIG. 7 illustrates a plot of the processing time only for the atmospheric pressure of FIG. 3 and expected thickness only for atmospheric pressure.

FIG. 7 shows a plot of the processing time K with only atmospheric pressure K and the expected thickness value L from FIG. 3.

The data of the processing time K with only atmospheric pressure which is the time including the second corrected value for every lot B (1-24 in the figure) and the expected thickness value L with only atmospheric pressure which is the thickness in the above condition from FIG. 3 are plotted.

The numbers NG03 deviated from the standard in the expected thickness value L with only atmospheric pressure is 9. In addition, the index of potential process capability Cp is 1.02, and the index of process capability Cpk is 0.2.

Figure 8:
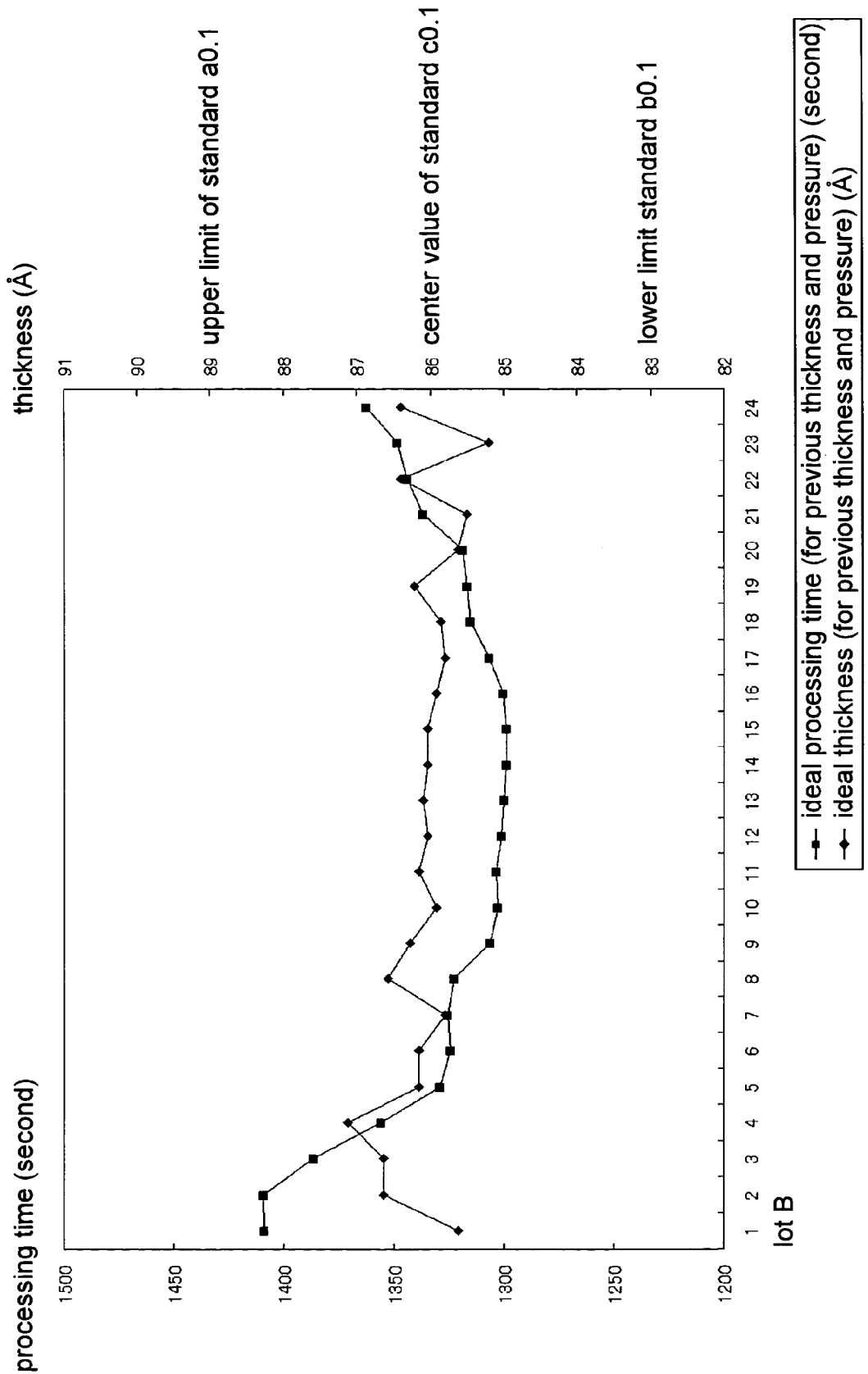
FIG. 8 illustrates a plot of ideal processing time and ideal thickness in FIG. 3.

FIG. 8 shows a plot of the ideal processing time M and the ideal thickness N from FIG. 3.

The data of the ideal processing time M which is the time including the first corrected value and second corrected value for every lot B (1-24 in the figure) and the ideal thickness N which is the thickness in the above condition in FIG. 3 are plotted.

The numbers NG04 deviated from the standard in the ideal thickness value N is 0. In addition, the index of potential process capability Cp is 2.39, and the index of process capability Cpk is 2.31. In this case, the index of process capability Cpk is clearly over 1.67 which is sufficient for process capability.

Next, an operation flow of an optimization method for deposition time of an embodiment of the present invention is explained.

Figure 9:
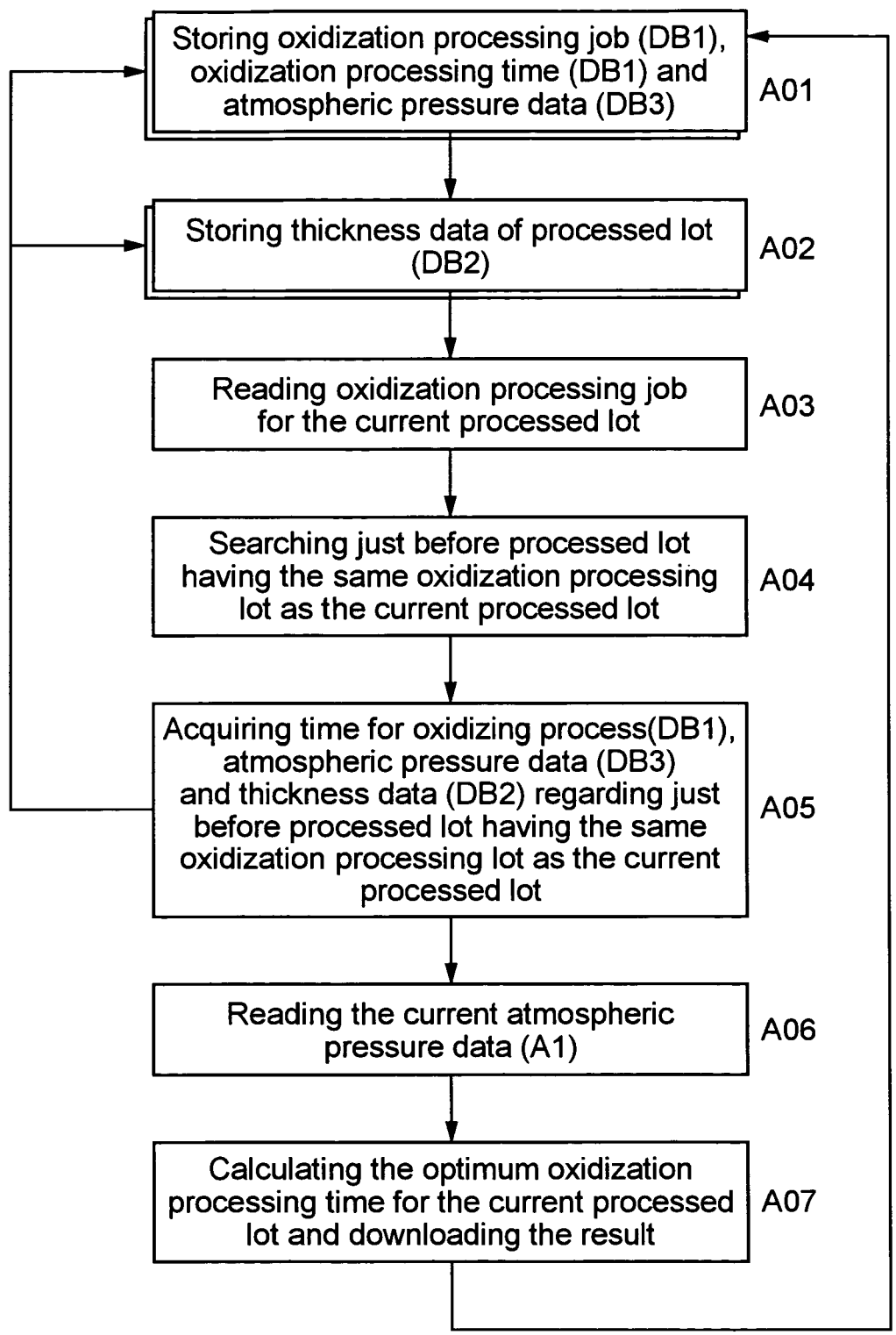
FIG. 9 shows a flow of outline processing in an optimization method for deposition time regarding the preferred embodiment of the present invention.

FIG. 9 is a schematic diagram showing an optimization method for deposition time according to an embodiment of the present invention.

An oxidation processing job history/oxidation processing time history DB1 and atmospheric pressure data A1 (atmospheric pressure data at the time) of the current processed lot are stored at step A01.

The data history DB2 of the processed lot is stored at step A02.

An oxidation processing job at the current lot is read at this time in step A03.

An immediately preceding lot of the same oxidation processing job which is the same as the current processed lot is searched at step A04.

The time DB1 for oxidation processing of an immediately preceding lot, atmospheric pressure data DB3, thickness data DB2, which are stored in steps A01 and A02, are acquired in step A05.

The current atmospheric pressure data A1 is read at step A06.

The most suitable oxidation processing time for the current processing is calculated and the result is downloaded at step A07. Then, the processes from step A01 are repeated.

Figure 10:
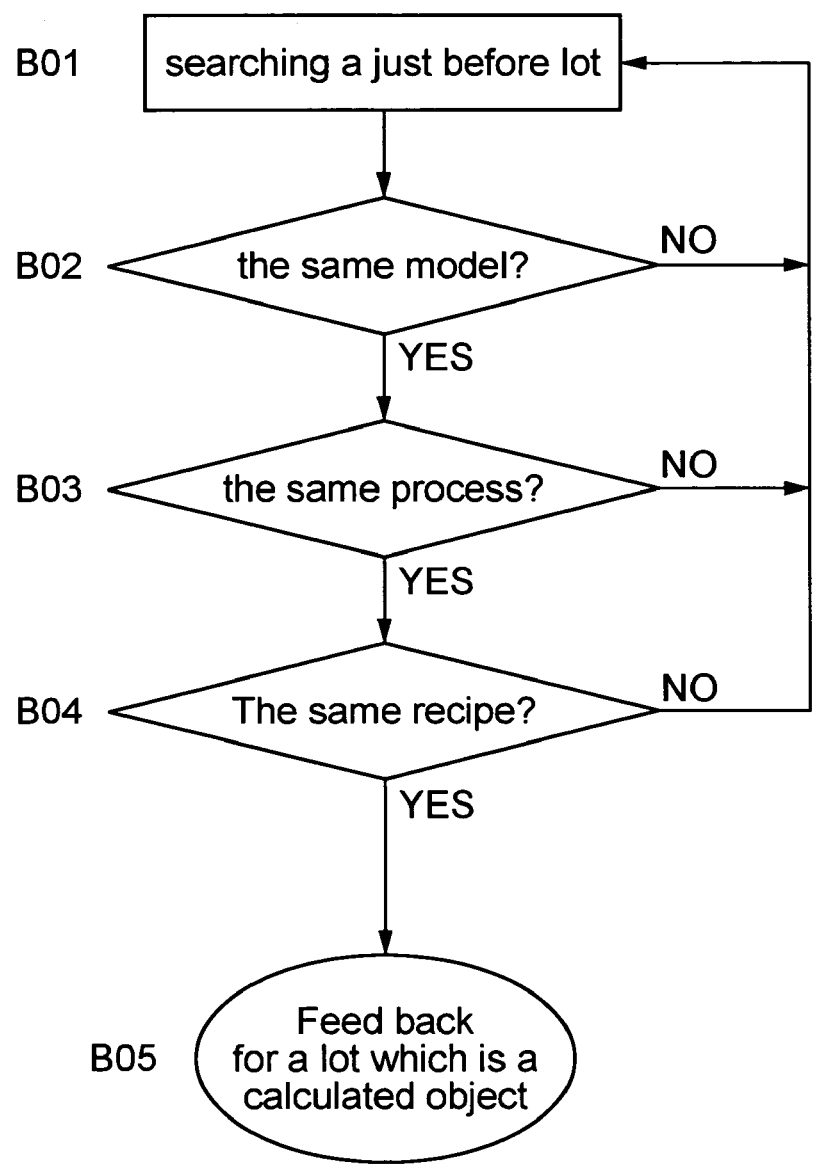
FIG. 10 shows a procedure for searching in step A04 of FIG. 9.

FIG. 10 shows the procedure for the searching process of step A04 in FIG. 9.

At first, an immediately preceding lot is searched in step B01.

It is then determined in step B02 whether the lot belongs to the same model of a product (the same product model).

In step B03, it is determined whether or not the lot belongs to the same process (Yes in the figure) when the lot is the same model.

In the step B04, it is determined whether or not the lot belongs to the same recipe (Yes in the figure) when the lot is in the same process.

When it is determined in step B04 that the lot is in the same recipe (Yes in the figure), the lot is adopted as a target lot to be used in a feed-back calculation (step B05). Namely, the lot is judged as the same oxidation processing job. When the lot is determined to not be in the same recipe in step B04 (No in the figure), the process returns to step B01.

When, in step B03, the lot is determined to not be in the same manufacturing process (No in the figure), the process returns to step B01.

When, in step B02, the lot is determined to not be in the same product model (No in the figure), the process returns to step B01.

Exemplary recipes are now shown as recipe 1 and recipe 2. In each recipe (STEP1, and STEP2 to 15), parameters such as processing time (VRTIME), temperature (TOP, T-C, CNT, C-B, BTM), time at TOP temperature, amount of gas flow (O2, N2, H2, Ar) are included. In addition, the parameter of VRTIME (processing time) is rewritten by NVA (the most suitable oxidation processing time calculated with HOST computer 10) before starting the processing of a lot from the formula shown in (a) above.

| VRTIME | STEP1 Temperature | Time | STEP2 to 15 amount of gas flow |
|---|---|---|---|
| Recipe 1:00 (200) | TOP; 750<br>T-C; 750<br>CNT; 750<br>C-B; 750<br>BTM; 750 | 30 | O2; 5<br>N2; 5<br>H2; 5<br>Ar; 5 |
| Recipe 2:00 (250) | TOP; 700<br>T-C; 700<br>CNT; 700<br>C-B; 700<br>BTM; 700 | 35 | O2; 6<br>N2; 6<br>H2; 6<br>Ar; 6 |

According to the preferred embodiment, an optimization method for deposition time and an optimization system for deposition time that are constituted as described above have the following advantages.

Atmospheric pressure data, thickness data and process history by the thermal process device 30, which are conventionally taken by manual handling, can be taken automatically to the process management system via an on-line network. Thus, there is no need for a worker to input data and the risk of input errors by a worker can be avoided and an improvement in operational efficiency can be realized.

Further, oxidation-processing time can be compensated from a database related to the thickness generation speed and atmospheric pressure. Also, oxidation processing with high precision (thickness generation) can be attained by correcting an actual value (thickness, treatment time and/or atmospheric pressure) in the same product model, the same process and the same recipe as the immediately preceding process.

In addition, in this preferred embodiment, oxidation processing was explained. However, the current process is not limited to oxidization gas if an object lot (a product) is reacted with gas in a heated (i.e., high temperature) gas atmosphere. The present invention, for example, can be applied to nitride processing by using nitrogen gas.

In addition, the present invention is not limited to the above mentioned, but can be adopted to an application of the preferred optimization method for deposition time regarding the present invention.

In addition, the present invention is not limited to the above mentioned embodiments and the number of the constitutional members, positions, and shapes can be applied to any preferred numbers, positions, and shapes.

In addition, in each figure, the same reference number refers to the same structural element.

Effects of the Invention

The present invention including the above-mentioned structure shows the following effects. It is possible to attain accurate data input by inputting atmospheric pressure data via an on-line network and calculating optimized oxidization time with high precision. Further, this optimized oxidization time can be processed by downloading directly to the oxidization processing device via the on-line network. As such, oxidization processing with high precision can be attained.

What is claimed is:

1. An optimization method for deposition time in a thermal oxidization process comprising:
   a first step of inputting a target thickness value of a product model processed with thermal oxidization into a host computer;
   a second step of transmitting current atmospheric pressure data at a start of processing obtained from a barometer and comparative data into the host computer via a network, the comparative data including an oxidization time of an immediately preceding processed lot in the same oxidization process as the product model and an average thickness value;
   a third step of adding a first correction value obtained from a difference between the target thickness value and an actual thickness value during an oxidization processing period for the immediately preceding lot and a second correction value obtained from a difference between the current atmospheric pressure data and an atmospheric pressure correction value obtained from previous atmospheric pressure data, and the third step calculating a time for desired oxidization processing based on a result of the adding; and
   a fourth step of transmitting the calculated time for the desired oxidization processing to an apparatus for performing a thermal oxidization process via the network, wherein, in the third step:
   the first correction value is calculated based on a value that is obtained from subtracting the average thickness value of an immediately preceding processed lot from a target thickness value of the same oxidization processing job; and
   the second correction value is calculated based on an atmospheric pressure at the time of processing an immediately preceding lot and a current atmospheric pressure.

2. The optimization method for deposition time according to claim 1, wherein the third step includes a searching process where a current lot and an immediately preceding lot recorded in a data base corresponding to the same oxidization processing job are searched and the comparative data is obtained.

3. The optimization method for deposition time according to claim 1, wherein in the third step:
   the first correction value is calculated by dividing the value obtained from subtracting the average thickness value of a processed lot from a target thickness value of the same oxidization processing job, with the rate of thickness per oxidization processing time for at least one of each piece of equipment and each processing job that is a rate of thickness growing speed per unit time; and
   the second correction value is calculated by a difference between a first atmospheric pressure function at the time of processing an immediately preceding lot and a second atmospheric pressure function at current atmospheric pressure wherein:
   the atmospheric pressure function=$aP^2+bP+c$;
   P equals atmospheric pressure;
   a, b, and c are fixed numbers; and a=0, b=0.4, and c=0.

4. The optimization method for deposition time according to claim 2, wherein the searching step includes:
   a step for judging a product model that searches an immediately preceding processed lot, which was recorded in the data base and judges whether the processed lot belongs to the same product model as the current lot;
   a step for judging whether the processed lot belongs to the same process, when the processed lot belongs to the same product model as the current lot in the step for judging a product model;

a step for judging whether the processed lot belongs to the same recipe, when the processed lot belongs to the same process as the current lot in the step for judging a process;

a step for judging that the processed lot belongs to the same oxidization processing job, when the processed lot belongs to the same recipe of the lot in the step for judging a recipe and adopting the processed lot as the comparative data.

5. The optimization method for deposition time according to claim 4, wherein, in the step for judging a recipe, a step for searching is conducted and the method returns to a step that searches an immediately preceding processed lot, when the recipe is determined not to be the same;

in the step for judging a process, the method returns to the step that searches an immediately preceding processed lot, when the process is determined not to be the same; and in the step for judging a product model, the method returns to the step that searches an immediately preceding processed lot, when the product model is determined to not be the same.

6. An optimization system for deposition time for thermal oxidation processing by using a network, comprising:

a host computer that receives a target thickness value for a product model processed with thermal oxidation and calculates a most suitable oxidation processing time;

a barometer that acquires current atmospheric pressure data which is atmospheric pressure data at a start time of processing; and a database that records comparison data which includes oxidation processing time, average thickness value and an atmospheric pressure value, wherein the host computer:

receives the current atmospheric pressure data and the comparison data of an immediately preceding processed lot of an oxidation processing job which is the same for the product model via the network;

adds a first correction value calculated from a difference between the target thickness value and the average thickness value during a time for processing the immediately preceding processed lot with oxidation to a second correction value calculated from a difference of atmospheric pressure correction values derived from current atmospheric pressure data and the previous atmospheric pressure value;

calculates the most optimized time for thermal oxidation processing based on the result of the addition;

sends the most optimized time for thermal oxidation processing to an apparatus for thermal oxidation processing via the network, wherein:

the first correction value is calculated based on the value obtained by subtracting the average thickness value of the immediately preceding processed lot from the target thickness value in the same oxidization processing job and the second correction value is calculated based on an atmospheric pressure at the time of processing the immediately preceding processed lot and a current atmospheric pressure.

7. The optimization system for deposition time according to claim 6, wherein:

the first correction value is calculated by dividing the value obtained from subtracting the average thickness value of the processed lot from a target thickness value of the same oxidization processing job with the rate of thickness/oxidization processing time for at least one of each piece of equipment and each processing job that is a rate of thickness growing speed per unit time; and the second correction value is calculated by a difference between a first atmospheric pressure function at a time of processing an immediately preceeding processed lot and a second atmospheric pressure function at the current atmospheric pressure wherein:

the atmospheric pressure function=$aP^2+bP+c$;

P equals atmospheric pressure; and a, b, and c are fixed numbers; and a=0. b=0.4, and c=0.

8. The optimization method for deposition time according to claim 6, wherein the host computer:

searches an immediately preceding processed lot, which was recorded in the data base;

judges whether the processed lot belongs to the same product model as the current lot;

judges whether the processed lot belongs to the same process, when the processed lot belongs to the same product model as the current lot;

judges whether the processed lot belongs to the same recipe, when the processed lot belongs to the same process as the current lot;

judges that the processed lot belongs to the same oxidization processing job, when the processed lot belongs to the same recipe as the current lot and adopts the processed lot as the comparison data.

9. The optimization method for deposition time according to claim 8, wherein the host computer:

searches an immediately preceding processed lot, when the recipe is determined not to be the same;

searches an immediately preceding processed lot, when the process is determined not to be the same; and searches an immediately preceding processed lot, when the product model is determined not to be the same.

* * * * *

UNITED STATES PATENT AND TRADEMARK OFFICE
CERTIFICATE OF CORRECTION

PATENT NO. : 7,280,884 B2  Page 1 of 1
APPLICATION NO. : 10/785711
DATED : October 9, 2007
INVENTOR(S) : Akihito Uetake et al.

It is certified that error appears in the above-identified patent and that said Letters Patent is hereby corrected as shown below:

Column 11, Line 7, Claim 4:   After 2$^{nd}$ occurrence of "the" insert --current--.

Signed and Sealed this

Eighth Day of April, 2008

JON W. DUDAS
*Director of the United States Patent and Trademark Office*